(12) United States Patent
Chen

(10) Patent No.: US 10,998,894 B1
(45) Date of Patent: May 4, 2021

(54) DUTY CYCLE CORRECTOR

(71) Applicant: REALTEK SEMICONDUCTOR CORPORATION, Hsinchu (TW)

(72) Inventor: Yung-Chung Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/110,350

(22) Filed: Dec. 3, 2020

(30) Foreign Application Priority Data

Feb. 3, 2020 (TW) .................................. 109103263

(51) Int. Cl.
*H03K 5/156* (2006.01)
(52) U.S. Cl.
CPC .................................. *H03K 5/1565* (2013.01)
(58) Field of Classification Search
None
See application file for complete search history.

(56) References Cited

U.S. PATENT DOCUMENTS

| | | | |
|---|---|---|---|
| 9,166,571 B2 * | 10/2015 | Connell | H03K 3/356104 |
| 2003/0222705 A1 * | 12/2003 | Tamura | H03F 3/45192 |
| | | | 327/538 |
| 2005/0253637 A1 * | 11/2005 | Mahadevan | H03K 5/1565 |
| | | | 327/175 |
| 2007/0159224 A1 * | 7/2007 | Dwarka | H03K 5/1565 |
| | | | 327/175 |
| 2008/0204097 A1 * | 8/2008 | Wu | H03K 5/1565 |
| | | | 327/175 |
| 2009/0284288 A1 * | 11/2009 | Zhang | H03K 3/356139 |
| | | | 327/118 |
| 2013/0249612 A1 * | 9/2013 | Zerbe | G11C 7/222 |
| | | | 327/161 |

* cited by examiner

*Primary Examiner* — Cassandra F Cox
(74) *Attorney, Agent, or Firm* — WPAT, PC

(57) ABSTRACT

Disclosed is a duty cycle corrector including a buffer circuit, an upper circuit, and a lower circuit. The buffer circuit includes: a first buffer circuit receiving a first input signal and thereby outputting a second output signal to a second output terminal; a second buffer circuit receiving a second input signal and thereby outputting a first output signal to a first output terminal; and a latch circuit coupled between the first and second output terminals. The upper circuit is coupled between a high voltage terminal and the buffer circuit and transmits current to the first and second output terminals according to each of the first and second input signals. The lower circuit is coupled between the buffer circuit and a low voltage terminal and withdraws current flowing through the first and second output terminals according to each of the first and second input signals.

11 Claims, 9 Drawing Sheets

DUTY CYCLE CORRECTOR

BACKGROUND OF THE INVENTION

1. Field of the Invention

The present disclosure relates to a signal corrector, especially to a signal corrector for correcting the duty cycle of a signal.

2. Description of Related Art

FIG. 1 shows a conventional alternating current (AC) coupling self-bias inverter buffer 100 with a latch circuit. The AC coupling self-bias inverter buffer 100 includes a first inverter buffer 110, a second inverter buffer 120, and a latch circuit 130. The first inverter buffer 110 includes a first capacitor 112, a first inverter 114, and a first resistor 116. The second inverter buffer 120 includes a second capacitor 122, a second inverter 124, and a second resistor 126. The latch circuit 130 include san inverter 132 and an inverter 134. As shown in FIG. 1, the first capacitor 112 and the second capacitor 122 are used for blocking direct current (DC) components; the first inverter 114 outputs an output signal "clkon" according to an input signal "clkip"; the second inverter 124 outputs an output signal "clkop" according to an input signal "clkin"; the first resistor 116 controls a DC bias at the input terminal of the first inverter 114 according to the output signal "clkon" of the first inverter 114; the second resistor 126 controls a DC bias at the input terminal of the second inverter 124 according to the output signal "clkop" of the second inverter 124; and the latch circuit 130 not only assists in realizing a rail-to-rail output, but also assists in making the duty cycle of the output signal "clkon" approach the duty cycle of the output signal "clkop".

Please refer to FIG. 1 and FIG. 2a. When the duty cycle of the input signal "clkip" of the first inverter 114 is equal to 50%, the duty cycle of the output signal "clkon" of the first inverter 114 is also equal to 50%, so that the first resistor 116 drives the DC bias at the input terminal of the first inverter 114 to be $V_{DD}/2$ according to the output signal "clkon", wherein $V_{DD}$ is the supply voltage for the buffer 100. Please refer to FIG. 1 and FIG. 2b, when the duty cycle of the input signal "clkip" of the first inverter 114 is less than 50%, the duty cycle of the output signal "clkon" of the first inverter 114 is greater than 50%, and the first resistor 116 drives the DC bias at the input terminal of the first inverter 114 to be higher than $V_{DD}/2$ according to the output signal "clkon". In the above-mentioned circumstance, the capability of the first inverter 114 pulling down the output signal "clkon" through an NMOS transistor (not shown) of the first inverter 114 is stronger than the capability of the first inverter 114 pulling up the output signal "clkon" through a PMOS transistor (not shown) of the first inverter 114, therefore the falling edge of the output signal "clkon" is more slanting than the rising edge of the output signal "clkon", and this causes the effective duty cycle of the output signal "clkon" tend towards 50% and thereby compensates for the unbalanced duty cycle of the input signal "clkip". Please refer to FIG. 1 and FIG. 2c, when the duty cycle of the input signal "clkip" of the first inverter 114 is greater than 50%, the duty cycle of the output signal "clkon" of the first inverter 114 is less than 50%, and the first resistor 116 drives the DC bias at the input terminal of the first inverter 114 to be lower than $V_{DD}/2$ according to the output signal "clkon". In the above-mentioned circumstance, the capability of the first inverter 114 pulling down the output signal "clkon" through the NMOS transistor of the first inverter 114 is weaker than the capability of the first inverter 114 pulling up the output signal "clkon" through the PMOS transistor of the first inverter 114, therefore the rising edge of the output signal "clkon" is more slanting than the falling edge of the output signal "clkon", and this causes the effective duty cycle of the output signal "clkon" tend towards 50% and thereby compensates for the unbalanced duty cycle of the input signal "clkip". The output signal "clkop" has the similar features. In light of the above, the buffer 100 can correct the duty cycle to make the effective duty cycles of the output signals "clkop", "clkon" approach 50%. It is noted that the waveforms of the signals "clkip, clkon" of FIGS. 2a-2c are exemplary for understanding; normally, the actual waves are usually not perfect square waves.

However, the buffer 100 of FIG. 1 has the following problems: when the driving capability of the latch circuit 130 is weaker than the driving capabilities of the first inverter buffer 110 and the second inverter buffer 120, the capability of correcting the duty cycle of the buffer 100 is also weak; when the driving capability of the latch circuit 130 is much stronger than the driving capabilities of the first inverter buffer 110 and the second inverter buffer 120, a latch-up problem of the output signal "clkop/clkon" may occur, which means that the output signal "clkop/clkon" may permanently stay at a low level (e.g., 0V) or a high level (1V). Accordingly, this technical field needs a solution having a good duty cycle correction capability and relaxing latch-up problems.

SUMMARY OF THE INVENTION

An object of the present disclosure is to provide a duty cycle corrector as an improvement over the prior art.

An embodiment of the duty cycle corrector of the present disclosure includes a buffer circuit, an upper circuit, and a lower circuit. The buffer circuit is configured to receive a first input signal via a first input terminal and receive a second input signal via a second input terminal, and configured to output a second output signal to a second output terminal according to the first input signal and output a first output signal to a first output terminal according to the second input signal, wherein the second input signal is equivalent to an inversion of the first input signal and the second output signal is equivalent to an inversion of the first output signal. The upper circuit is coupled between a high voltage terminal and the buffer circuit, and includes a first upper switch circuit and a second upper switch circuit. The first upper switch circuit is coupled between the high voltage terminal and the buffer circuit, and configured to transmit current to the second output terminal and the first output terminal according to the first input signal on condition that the first upper switch circuit is turned on for conduction. The second upper switch circuit is parallel to the first upper switch circuit and coupled between the high voltage terminal and the buffer circuit, and is configured to transmit current to the first output terminal and the second output terminal according to the second input signal on condition that the second upper switch circuit is turned on for conduction. The lower circuit is coupled between the buffer circuit and a low voltage terminal, and includes a first lower switch circuit and a second lower switch circuit. The first lower switch circuit is coupled between the buffer circuit and the low voltage terminal, and configured to withdraw current flowing through the second output terminal and the first output terminal according to the first input signal on condition that the first lower switch circuit is turned on for conduction, wherein a requirement for turning on the first lower switch circuit is different from a requirement for turning on the first upper switch circuit. The second lower switch circuit is parallel to the first lower switch circuit and coupled between the buffer circuit and the low voltage terminal, and is configured to withdraw current flowing through the first output terminal and the second output terminal according to the second input signal on condition that the second lower switch circuit is turned on for conduction, wherein a requirement for turning on the second lower switch circuit is different from a requirement for turning on the second upper switch circuit.

Another embodiment of the duty cycle corrector of the present disclosure includes a buffer circuit, an upper circuit, and a lower circuit. The buffer circuit includes a first buffer circuit, a second buffer circuit, and a latch circuit. The first buffer circuit is configured to output a second output signal to a second output terminal according to a first input signal. The second buffer circuit is configured to output a first output signal to a first output terminal according to a second input signal, wherein the second input signal is equivalent to an inversion of the first input signal. The latch circuit is coupled between the first output terminal and the second output terminal. The upper circuit is coupled between a high voltage terminal and the buffer circuit, and configured to transmit current to the second output terminal and the first output terminal according to the first input signal and to transmit current to the first output terminal and the second output terminal according to the second input signal. The lower circuit is coupled between the buffer circuit and a low voltage terminal, and configured to withdraw current flowing through the second output terminal and the first output terminal according to the first input signal and to withdraw current flowing through the first output terminal and the second output terminal according to the second input signal, wherein a requirement for turning on the lower circuit is different from a requirement for turning on the upper circuit.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 3b shows a duty cycle correction comparison between an output signal "clkon/clkop" and an input signal "clkip/clkin" of FIG. 3a.

FIG. 4 shows an embodiment of the buffer circuit of FIG. 3a.

DETAILED DESCRIPTION OF THE PREFERRED EMBODIMENTS

The present disclosure discloses a duty cycle corrector. The duty cycle corrector has a good capability of correcting the duty cycle of a signal, and is capable of preventing latch-up problems.

Figure 1:
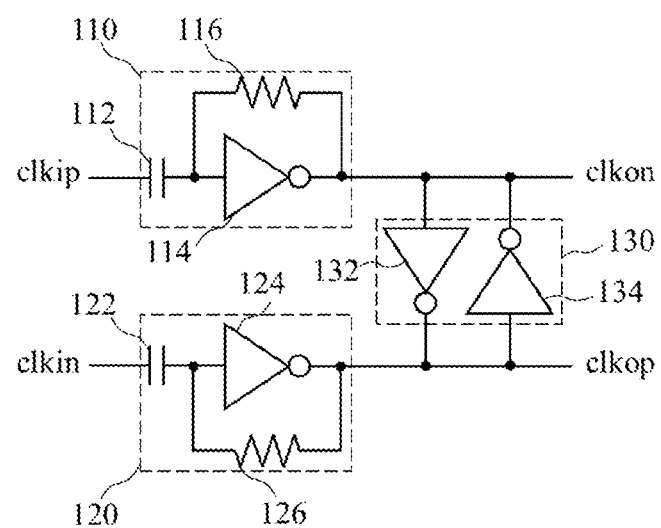
FIG. 1 shows a conventional alternating current (AC) coupling self-bias inverter buffer with a latch circuit.
Figure 2A:
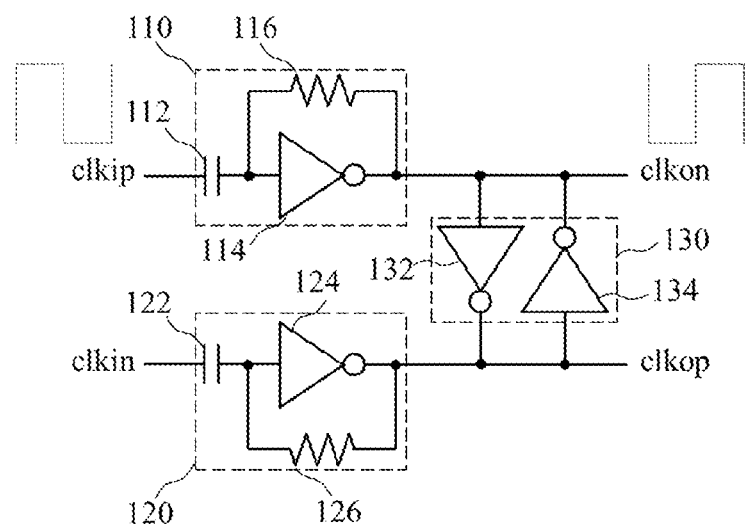
FIG. 2a shows a waveform of an output signal "clkon" of FIG. 1 when the duty cycle of an input signal "clkip" of FIG. 1 is equal to 50%.
Figure 2B:
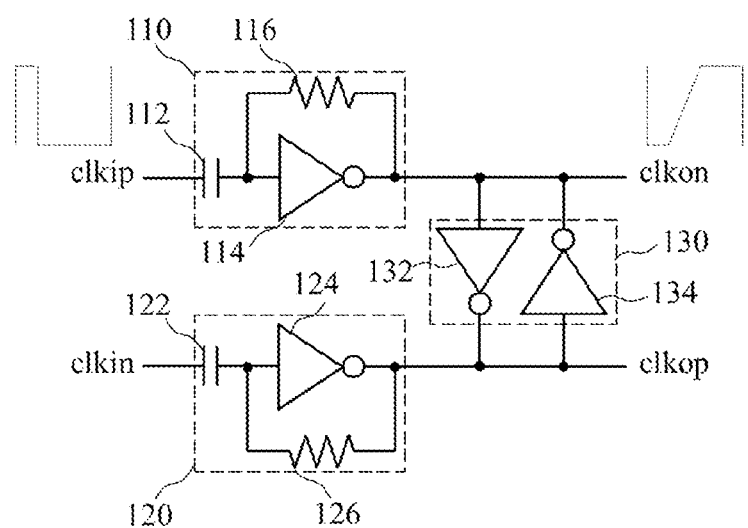
FIG. 2b shows a waveform of an output signal "clkon" of FIG. 1 when the duty cycle of an input signal "clkip" of FIG. 1 is less than 50%.
Figure 2C:
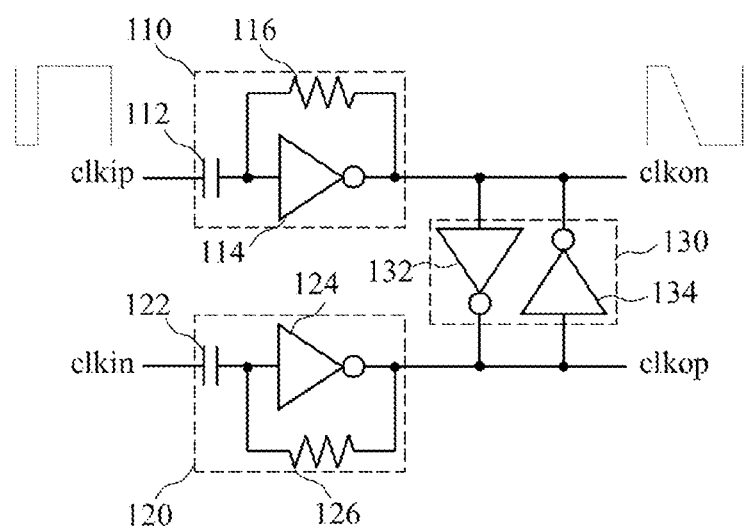
FIG. 2c shows a waveform of an output signal "clkon" of FIG. 1 when the duty cycle of an input signal "clkip" of FIG. 1 is greater than 50%.
Figure 3A:
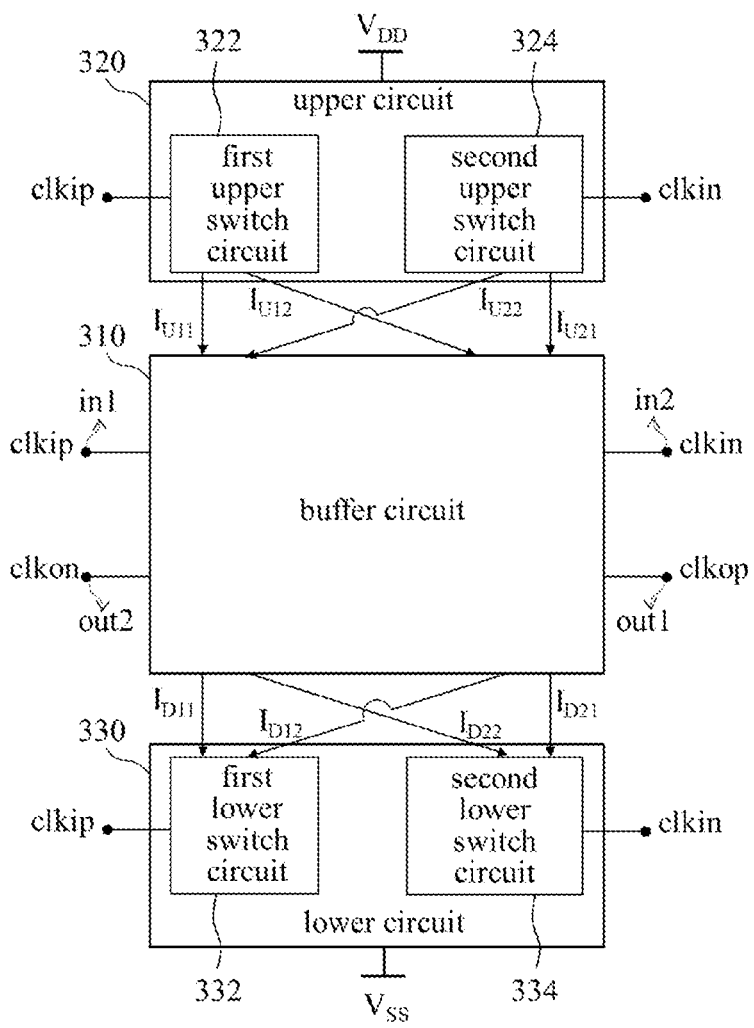
FIG. 3a shows an embodiment of the duty cycle corrector of the present disclosure.

FIG. 3a shows an embodiment of the duty cycle corrector of the present disclosure. The duty cycle corrector 300 of FIG. 3a includes a buffer circuit 310, an upper circuit 320, and a lower circuit 330. The buffer circuit 310 is configured to receive a first input signal "clkip" (e.g., a clock signal, or any signal supposed to have a duty cycle "50%") via a first input terminal (in1) and receive a second input signal "clkin" via a second input terminal (in2), and configured to output a second output signal "clkon" to a second output terminal (out2) according to the first input signal "clkip" and output a first output signal "clkop" to a first output terminal (out1) according to the second input signal "clkin". The second input signal "clkin" is equivalent to an inversion of the first input signal "clkip", which means that the two input signals "clkip, clkin" are complementary and form a differential signal. The second output signal "clkon" is equivalent to an inversion of the first output signal "clkop", which means that the two output signals "clkop, clkon" are complementary and form a differential signal.

Please refer to FIG. 3a. The upper circuit 320 is coupled between a high voltage terminal $V_{DD}$ (e.g., a power supply terminal) and the buffer circuit 310, and includes a first upper switch circuit 322 and a second upper switch circuit 324. Each of the two switch circuits 322, 324 is configured to transmit current to the first and second output terminals (out1, out2) to improve the duty cycles of the two output signals "clkop, clkon". The lower circuit 330 is coupled between the buffer circuit 310 and a low voltage terminal $V_{SS}$ (e.g., a ground terminal), and includes a first lower switch circuit 322 and a second lower switch circuit 334. Each of the two switch circuits 332, 334 is configured to withdraw current flowing through the first and second output terminals (out1, out2) to improve the duty cycles of the two output signals "clkop, clkon". Please refer to FIG. 3b showing a duty cycle correction effect on the output signal "clkon/clkop" of FIG. 3a; in the embodiment of FIG. 3a, an absolute value of a difference between the duty cycle of the first input signal "clkip" and fifty percent (i.e., |duty cycle of clkip—50%|) is greater than an absolute value of a difference between the duty cycle of the second output signal "clkon" and fifty percent (i.e., |duty cycle of clkon—50%|).

Figure 3B:
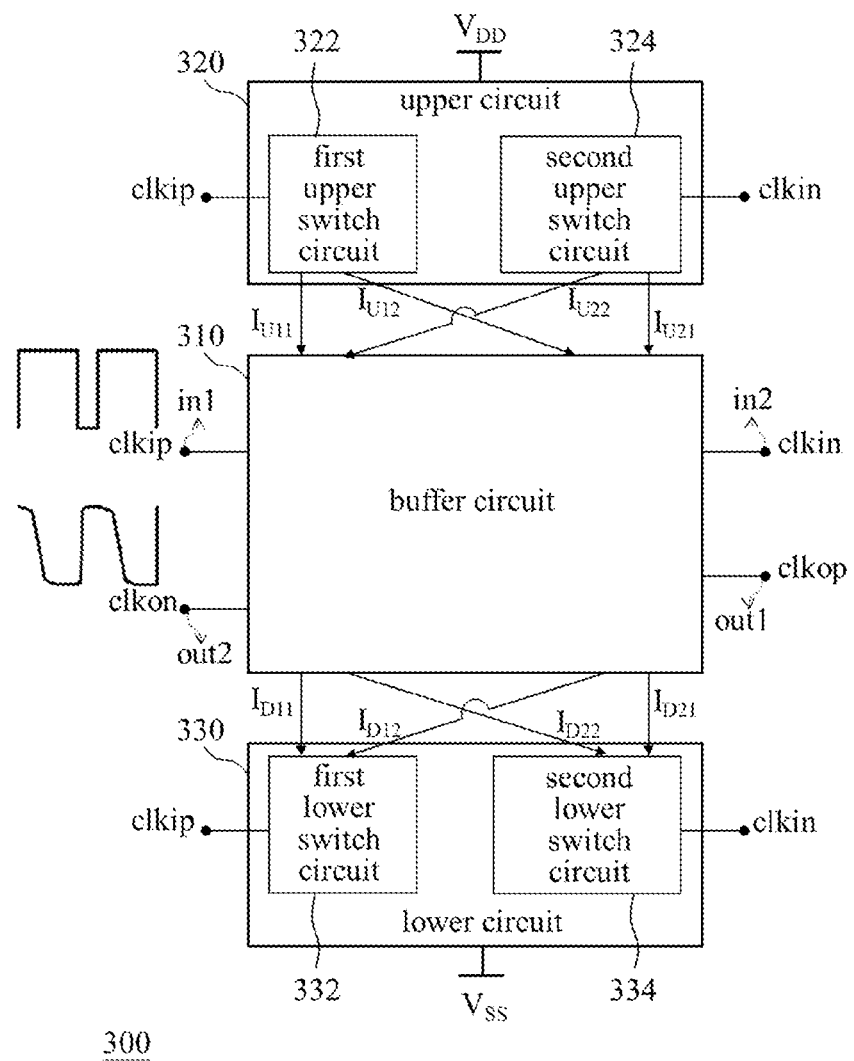

Please refer to FIG. 3b. The first upper switch circuit 322 is coupled between the high voltage terminal $V_{DD}$ and the buffer circuit 310, and configured to be turned on or turned off according to the first input signal "clkip"; accordingly, when the first upper switch circuit 322 is turned on for conduction, it transmits current $I_{U11}$ to the second output terminal (out2) via an original current path and transmits current $I_{U12}$ to the first output terminal (out1) via an additional current path. The second upper switch circuit 324 is parallel to the first upper switch circuit 322 and coupled between the high voltage terminal $V_{DD}$ and the buffer circuit 310, and is configured to be turned on or turned off according to the second input signal "clkin"; accordingly, when second upper switch circuit 324 is turned on for conduction, it transmits current $I_{U21}$ to the first output terminal (out1) via an original current path and transmits current $I_{U22}$ to the second output terminal (out2) via an additional current path. The first lower switch circuit 332 is coupled between the buffer circuit 310 and the low voltage terminal $V_{SS}$, and configured to be turned on or turned off according to the first input signal "clkip"; accordingly, when the first lower switch circuit 332 is turned on for conduction, it withdraws current $I_{U11}$, which flows through the second output terminal (out2), from an original current path and withdraws current $I_{D12}$, which flows through the first output terminal (out1), from an additional current path, wherein a requirement for turning on the first lower switch circuit 332 is different from a requirement for turning on the first upper switch circuit 322. The second lower switch circuit 334 is parallel to the first lower switch circuit 332 and coupled between the buffer circuit 310 and the low voltage terminal $V_{SS}$, and is configured to be turned on or turned off according to the second input signal "clkin"; accordingly, when the second lower switch circuit 334 is turned on, it withdraws current $I_{D21}$, which flows through the first output terminal (out1), from an original current path and withdraws current $I_{D22}$, which flows through the second output terminal (out2), from an additional current path, wherein a requirement for turning on the second lower switch circuit 334 is different from a requirement for turning on the second upper switch circuit 324.

Figure 4:
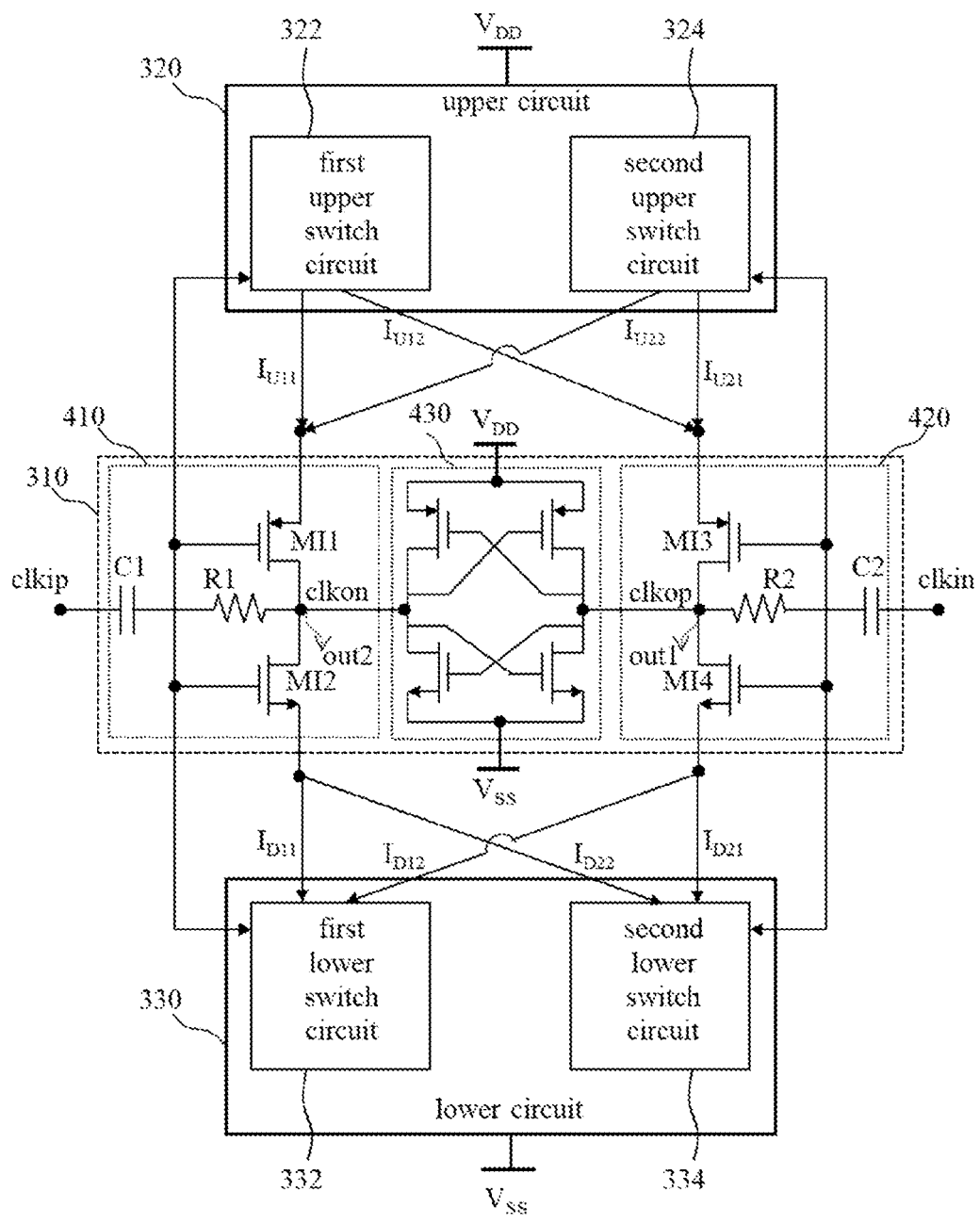

FIG. 4 shows an embodiment of the buffer circuit 310 of FIG. 3a. The buffer circuit 310 of FIG. 4 is an alternating current (AC) coupling self-bias inverter buffer with a latch circuit, and includes a first buffer circuit 410, a second buffer circuit 420, and a latch circuit 430. The first buffer circuit 410 is coupled between the first upper switch circuit 322 and the first lower switch circuit 332, and configured to receive the first input signal "clkip" from the first input terminal and then output the second output signal "clkon" with the second output terminal (out2). The second buffer circuit 420 is coupled between the second upper switch circuit 324 and the second lower switch circuit 334, and configured to receive the second input signal "clkin" from the second input terminal and then output the first output signal "clkop" with the first output terminal (out1). The latch circuit 430 is coupled between the first output terminal (out1) and the second output terminal (out2), and configured to not only assist in realizing a rail-to-rail output, but also assist in making the duty cycle of the output signal "clkon" approach the duty cycle of the output signal "clkop".

Please refer to FIG. 4. The first buffer circuit 410 includes: a first capacitor C1; a first inverter composed of a transistor MI1 and a transistor MI2; and a first impedance circuit R1 (e.g., a resistor). The first capacitor C1 is coupled between the first input terminal (i.e., terminal for receiving "clkip") and the first inverter; an input terminal of the first inverter is coupled to the first capacitor C1, and an output terminal of the first inverter is coupled to the second output terminal (out2); and the first impedance circuit R1 is coupled between the input terminal of the first inverter and the output terminal of the first inverter. The second buffer circuit 420 includes: a second capacitor C2; a second inverter composed of a transistor MI3 and a transistor MI4; and a second impedance circuit R2 (e.g., a resistor). The second capacitor C2 is coupled between the second input terminal (i.e., terminal for receiving "clkin") and the second inverter; an input terminal of the second inverter is coupled to the second capacitor C2, and an output terminal of the second inverter is coupled to the first output terminal (out1); and the second impedance circuit R2 is coupled between the input terminal of the second inverter and the output terminal of the second inverter. The latch circuit 430 is coupled between the high voltage terminal $V_{DD}$ and the low voltage terminal $V_{SS}$, and includes two inverters that are configured to generate the output signals "clkop, clkon" in accordance with the input signals "clkip, clkin" respectively.

Figure 5:
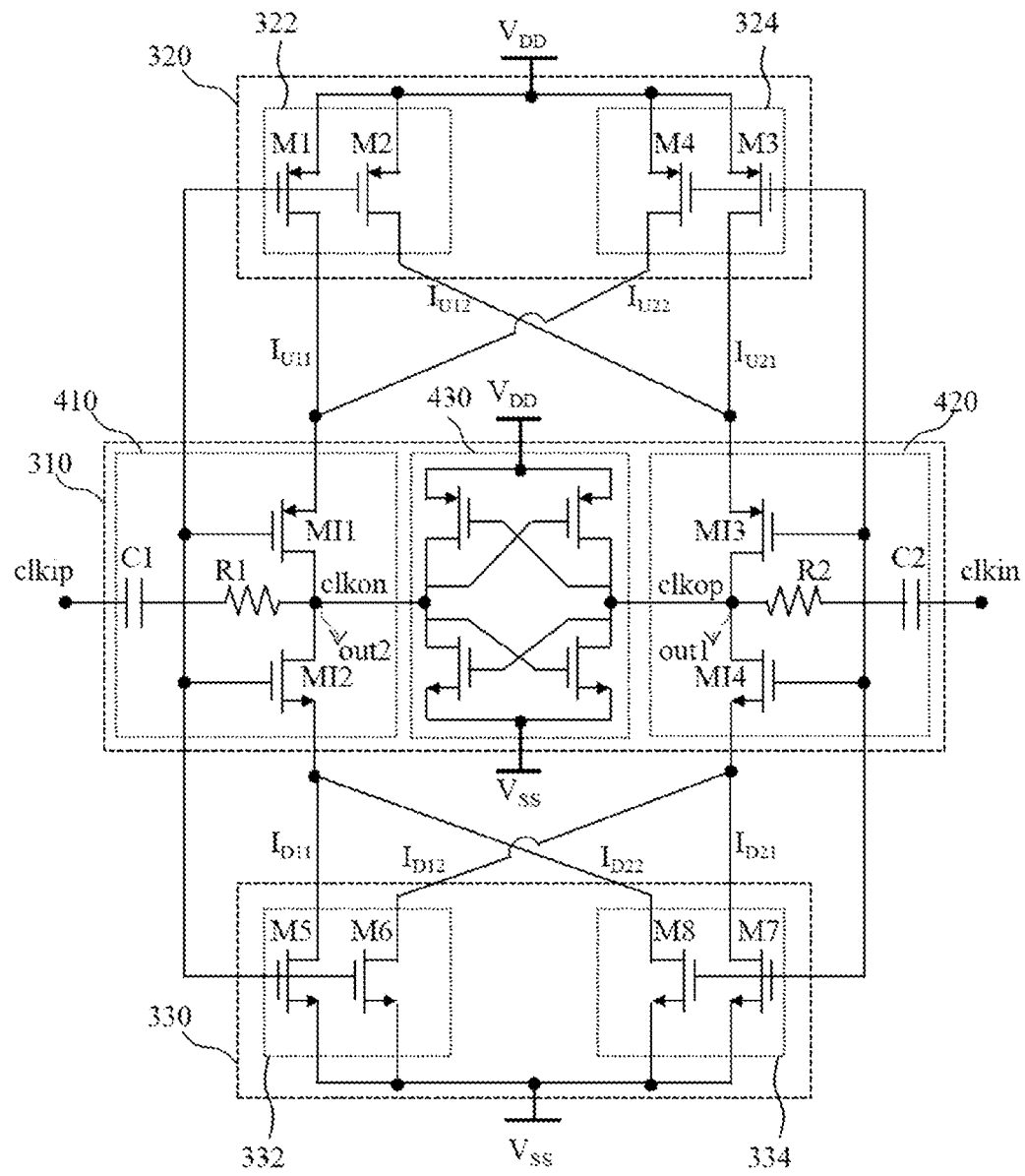
FIG. 5 shows an embodiment of the first upper switch circuit, second upper switch circuit, first lower switch circuit, and second lower switch circuit of FIG. 4.

FIG. 5 shows an embodiment of the first upper switch circuit 322, second upper switch circuit 324, first lower switch circuit 332, and second lower switch circuit 334. As shown in FIG. 5, the first upper switch circuit 322 includes a first transistor in1 and a second transistor M2. The first transistor in1 is coupled between the high voltage terminal $V_{DD}$ and the first buffer circuit 410, and configured to transmit current $I_{U11}$ to the second output terminal (out2) according to the first input signal "clkip" on condition that the first transistor in1 is turned on for conduction. The second transistor M2 is coupled between the high voltage terminal $V_{DD}$ and the second buffer circuit 420, and configured to transmit current $I_{U12}$ to the first output terminal (out1) according to the first input signal "clkip" on condition that the second transistor M2 is turned on for conduction. The second upper switch circuit 324 includes a third transistor M3 and a fourth transistor M4. The third transistor M3 is coupled between the high voltage terminal $V_{DD}$ and the second buffer circuit 420, and configured to transmit current $I_{U21}$ to the first output terminal (out1) according to the second input signal "clkin" on condition that the third transistor M3 is turned on for conduction. The fourth transistor M4 is coupled between the high voltage terminal $V_{DD}$ and the first buffer circuit 410, and configured to transmit current $I_{U22}$ to the second output terminal (out2) according to the second input signal "clkin" on condition that the fourth transistor M4 is turned on for conduction. The first lower switch circuit 332 includes a fifth transistor M5 and a sixth transistor M6. The fifth transistor M5 is coupled between the first buffer circuit 410 and the low voltage terminal $V_{SS}$, and configured to withdraw current $I_{D11}$ flowing through the second output terminal (out2) according to the first input signal "clkip" on condition that the fifth transistor M5 is turned on for conduction. The sixth transistor M6 is coupled between the first buffer circuit 410 and the low voltage terminal $V_{SS}$, and configured to withdraw current $I_{D12}$ flowing through the first output terminal (out1) according to the first input signal "clkip" on condition that the sixth transistor M6 is turned on for conduction. The second lower switch circuit 334 includes a seventh transistor M7 and an eighth transistor M8. The seventh transistor M7 is coupled between the second buffer circuit 420 and the low voltage terminal $V_{SS}$, and configured to withdraw current $I_{D21}$ flowing through the first output terminal (out1) according to the second input signal "clkin" on condition that the seventh transistor M7 is turned on for conduction. The eighth transistor M8 is coupled between the second buffer circuit 420 and the low voltage terminal $V_{SS}$, and configured to withdraw current $I_{D22}$ flowing through the second output terminal (out2) according to the second input signal "clkin" on condition that the eighth transistor M8 is turned on for conduction. In this embodiment, each of the transistors M1~M4 is a first type of transistor (e.g., a PMOS transistor); each of the transistors M5~M8 is a second type of transistor (e.g., an NMOS transistor); and a requirement for turning on the first type of transistor is different from a requirement for turning on the second type of transistor.

Figure 6:
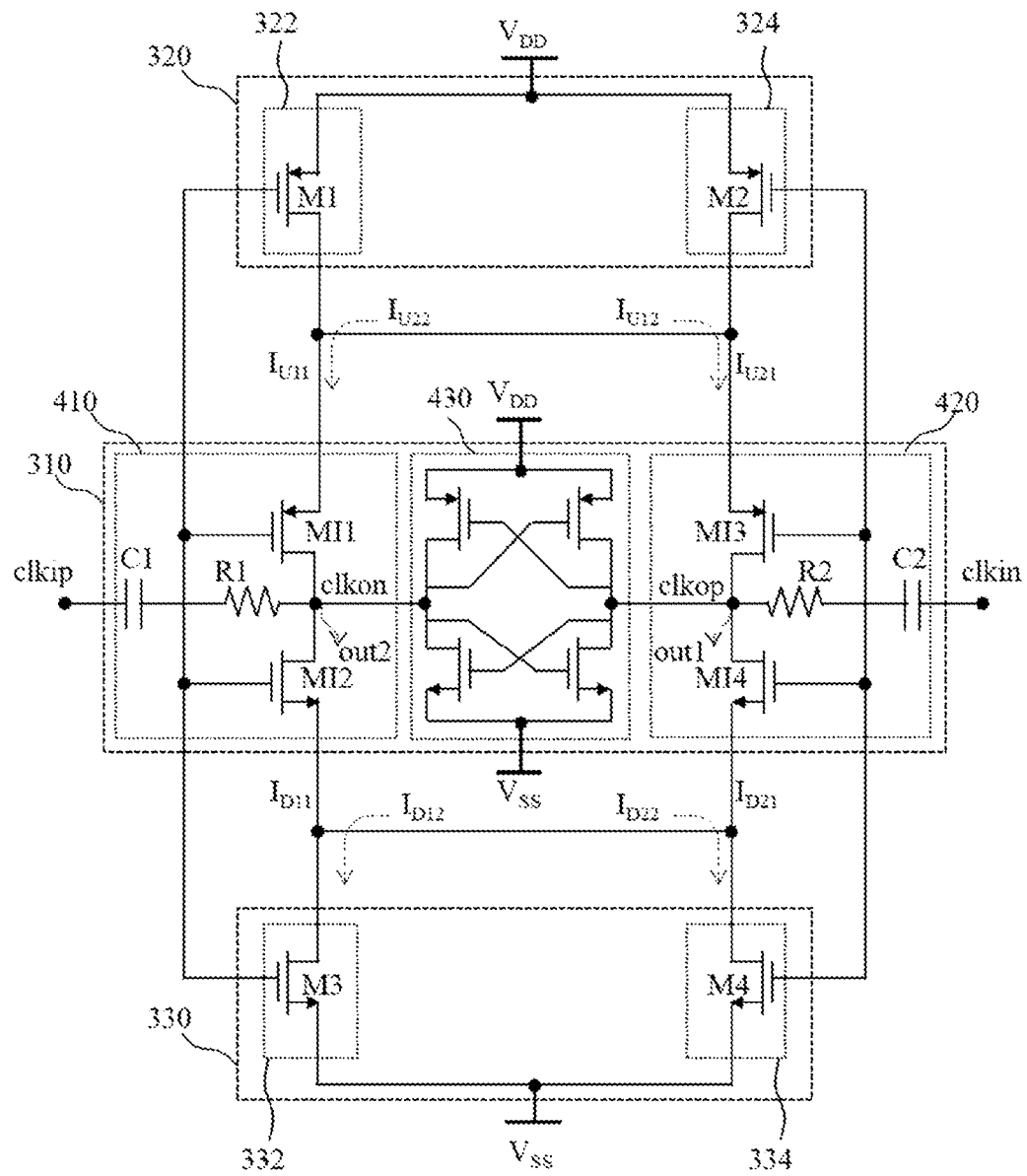
FIG. 6 shows another embodiment of the first upper switch circuit, second upper switch circuit, first lower switch circuit, and second lower switch circuit of FIG. 4.

FIG. 6 shows another embodiment of the first upper switch circuit 322, second upper switch circuit 324, first lower switch circuit 332, and second lower switch circuit 334. As shown in FIG. 6, the first upper switch circuit 322 includes: a first transistor M1 coupled between the high voltage terminal $V_{DD}$ and the first buffer circuit 410, and configured to transmit current $I_{U11}$ to the second output terminal (out2) and transmit current $I_{U12}$ to the first output terminal (out1) according to the first input signal "clkip" on condition that the first transistor M1 is turned on for conduction. The second upper switch circuit 324 includes: a second transistor M2 coupled between the high voltage terminal $V_{DD}$ and the second buffer circuit 420, and configured to transmit current $I_{U21}$ to the first output terminal (out1) and transmit current $I_{U22}$ to the second output terminal (out2) according to the second input signal "clkin" on condition that the second transistor M2 is turned on for conduction. The first lower switch circuit 332 includes: a third transistor M3 coupled between the first buffer circuit 410 and the low voltage terminal $V_{SS}$, and configured to withdraw current $I_{D11}$ flowing through the second output terminal (out2) and withdraw current $I_{U12}$ flowing through the first output terminal (out1) according to the first input signal "clkip" on condition that the third transistor M3 is turned on for conduction. The second lower switch circuit 334 includes: a fourth transistor M4 coupled between the second buffer circuit 420 and the low voltage terminal $V_{SS}$, and configured to withdraw current $I_{D21}$ flowing through the first output terminal (out1) and withdraw current $I_{D22}$ flowing through the second output terminal (out2) according to the second input signal "clkin" on condition that the fourth transistor M4 is turned on for conduction. In this embodiment, each of the transistors M1~M2 is a first type of transistor (e.g., a PMOS transistor); each of the transistors M3~M4 is a second type of transistor (e.g., an NMOS transistor); and a requirement for turning on the first type of transistor is different from a requirement for turning on the second type of transistor. It is noted that each of the transistors M1~M4 can optionally be composed of a plurality of small-size transistors whose gates are connected together, drains are connected together, and sources are connected together.

Please refer to FIGS. 4-6. The introduction of the upper circuit 320 leads to a longer current path between the high voltage terminal $V_{DD}$ and each of the two output terminals (out1, out2) (or each of the first and second buffer circuits 410, 420), and the introduction of the lower circuit 330 leads to a longer current path between each of the two output terminals (out1, out2) (or each of the first and second buffer circuits 410, 420) and the low voltage terminal $V_{SS}$. In order to compensate for the influence of the above-mentioned longer current paths and ensure that the driving capabilities of the first and second buffer circuits 410, 420 are strong enough in comparison with the driving capability of the latch circuit 430, an equivalent width-over-length ratio (width/length) of each transistor in the upper circuit 320, the lower circuit 330, length the first buffer circuit 410, and the second buffer circuit 420 can be determined (e.g., increased/decreased) with a multi-finger layout design method and/or a multiplier layout design method (i.e., to connect several transistors having small width-over-length ratios in parallel and thereby form a transistor having a large width-over-length ratio), so as to ensure the influence of the upper circuit 320 and lower circuit 330 on the driving capability of the first buffer circuit 410 and second buffer circuit 420 is negligible or tolerable. Since the multi-finger layout design method and the multiplier layout design method are known in this technical field, their detail is omitted here. It is noted that the two design methods can be applied to the design of the transistor(s) of the latch circuit 430.

It is noted that people of ordinary skill in the art can selectively use some or all of the features of any embodiment in this specification or selectively use some or all of the features of multiple embodiments in this specification to implement the present invention as long as such implementation is practicable, which implies that the way to implement the present invention can be flexible.

To sum up, the duty cycle corrector of the present disclosure makes use of additional circuits (i.e., the aforementioned upper and lower circuits) to improve the duty cycle of an output signal and prevent latch-up problems.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A duty cycle corrector, comprising:
   a buffer circuit configured to receive a first input signal via a first input terminal and receive a second input signal via a second input terminal, and to output a second output signal to a second output terminal according to the first input signal and output a first output signal to a first output terminal according to the second input signal, wherein the second input signal is equivalent to an inversion of the first input signal and the second output signal is equivalent to an inversion of the first output signal;
   an upper circuit being coupled between a high voltage terminal and the buffer circuit, and including:
      a first upper switch circuit coupled between the high voltage terminal and the buffer circuit, and configured to transmit current to the second output terminal and the first output terminal according to the first input signal on condition that the first upper switch circuit is turned on for conduction; and
      a second upper switch circuit being parallel to the first upper switch circuit and coupled between the high voltage terminal and the buffer circuit, and being configured to transmit current to the first output terminal and the second output terminal according to the second input signal on condition that the second upper switch circuit is turned on for conduction; and
   a lower circuit being coupled between the buffer circuit and a low voltage terminal, and including:
      a first lower switch circuit coupled between the buffer circuit and the low voltage terminal, and configured to withdraw current flowing through the second output terminal and the first output terminal according to the first input signal on condition that the first lower switch circuit is turned on for conduction, wherein a requirement for turning on the first lower switch circuit is different from a requirement for turning on the first upper switch circuit; and
      a second lower switch circuit being parallel to the first lower switch circuit and coupled between the buffer circuit and the low voltage terminal, and being configured to withdraw current flowing through the first output terminal and the second output terminal according to the second input signal on condition that the second lower switch circuit is turned on for conduction, wherein a requirement for turning on the second lower switch circuit is different from a requirement for turning on the second upper switch circuit.

2. The duty cycle corrector of claim 1, wherein an absolute value of a difference between a duty cycle of the first input signal and fifty percent is greater than an absolute value of a difference between a duty cycle of the second output signal and fifty percent.

3. The duty cycle corrector of claim 1, wherein the buffer circuit includes:
   a first buffer circuit coupled between the first upper switch circuit and the first lower switch circuit, and configured to receive the first input signal from the first input terminal and output the second output signal to the second output terminal;
   a second buffer circuit coupled between the second upper switch circuit and the second lower switch circuit, and configured to receive the second input signal from the second input terminal and output the first output signal to the first output terminal; and
   a latch circuit coupled between the first output terminal and the second output terminal.

4. The duty cycle corrector of claim 3, wherein:
   the first buffer circuit includes a first capacitor, a first inverter, and a first impedance circuit, in which:
      the first capacitor is coupled between the first input terminal and the first inverter;
      an input terminal of the first inverter is coupled to the first capacitor and an output terminal of the first inverter is coupled to the second output terminal; and
      the first impedance circuit is coupled between the input terminal of the first inverter and the output terminal of the first inverter;
   the second buffer circuit includes a second capacitor, a second inverter, and a second impedance circuit, in which:
      the second capacitor is coupled between the second input terminal and the second inverter;
      an input terminal of the second inverter is coupled to the second capacitor and an output terminal of the second inverter is coupled to the first output terminal; and
      the second impedance circuit is coupled between the input terminal of the second inverter and the output terminal of the second inverter; and
   the latch circuit includes:
      a third inverter having an input terminal coupled to the second output terminal, and having an output terminal coupled to the first output terminal; and
      a fourth inverter having an input terminal coupled to the first output terminal, and having an output terminal coupled to the second output terminal.

5. The duty cycle corrector of claim 3, wherein:
   the first upper switch circuit includes:
      a first transistor coupled between the high voltage terminal and the first buffer circuit, and configured to transmit current to the second output terminal according to the first input signal on condition that the first transistor is turned on; and
      a second transistor coupled between the high voltage terminal and the second buffer circuit, and configured to transmit current to the first output terminal according to the first input signal on condition that the second transistor is turned on;
   the second upper switch circuit includes:
      a third transistor coupled between the high voltage terminal and the second buffer circuit, and configured to transmit current to the first output terminal according to the second input signal on condition that the third transistor is turned on; and
      a fourth transistor coupled between the high voltage terminal and the first buffer circuit, and configured to transmit current to the second output terminal according to the second input signal on condition that the fourth transistor is turned on;
   the first lower switch circuit includes:
      a fifth transistor coupled between the first buffer circuit and the low voltage terminal, and configured to withdraw current flowing through the second output terminal according to the first input signal on condition that the fifth transistor is turned on; and
      a sixth transistor coupled between the first buffer circuit and the low voltage terminal, and configured to withdraw current flowing through the first output terminal according to the first input signal on condition that the sixth transistor is turned on; and
   the second lower switch circuit includes:
      a seventh transistor coupled between the second buffer circuit and the low voltage terminal, and configured to withdraw current flowing through the first output terminal according to the second input signal on condition that the seventh transistor is turned on; and
      an eighth transistor coupled between the second buffer circuit and the low voltage terminal, and configured to withdraw current flowing through the second output terminal according to the second input signal on condition that the eighth transistor is turned on.

6. The duty cycle corrector of claim 5, wherein each of the first transistor, the second transistor, the third transistor, and the fourth transistor is a first type of transistor; each of the fifth transistor, the sixth transistor, the seventh transistor, and the eighth transistor is a second type of transistor; and a requirement for turning on the first type of transistor is different from a requirement for turning on the second type of transistor.

7. The duty cycle corrector of claim 3, wherein:
   the first upper switch circuit includes:
      a first transistor coupled between the high voltage terminal and the first buffer circuit, and configured to transmit current to the second output terminal and the first output terminal according to the first input signal on condition that the first transistor is turned on;
   the second upper switch circuit includes:
      a second transistor coupled between the high voltage terminal and the second buffer circuit, and configured to transmit current to the first output terminal and the second output terminal according to the second input signal on condition that the second transistor is turned on;
   the first lower switch circuit includes:
      a third transistor coupled between the first buffer circuit and the low voltage terminal, and configured to withdraw current flowing through the second output terminal and the first output terminal according to the first input signal on condition that the third transistor is turned on; and
   the second lower switch circuit includes:
      a fourth transistor coupled between the second buffer circuit and the low voltage terminal, and configured to withdraw current flowing through the first output terminal and the second output terminal according to the second input signal on condition that the fourth transistor is turned on.

8. The duty cycle corrector of claim 7, wherein each of the first transistor and the second transistor is a first type of transistor; each of the third transistor and the fourth transistor is a second type of transistor; and a requirement for turning on the first type of transistor is different from a requirement for turning on the second type of transistor.

9. The duty cycle corrector of claim 1, wherein the first input signal is a clock signal, the high voltage terminal is a power supply terminal, and the low voltage terminal is a ground terminal.

10. A duty cycle corrector, comprising:
- a buffer circuit including:
  - a first buffer circuit configured to output a second output signal to a second output terminal according to a first input signal;
  - a second buffer circuit configured to output a first output signal to a first output terminal according to a second input signal, wherein the second input signal is equivalent to an inversion of the first input signal; and
  - a latch circuit coupled between the first output terminal and the second output terminal;
- an upper circuit coupled between a high voltage terminal and the buffer circuit, and configured to transmit current to the second output terminal and the first output terminal according to the first input signal and to transmit current to the first output terminal and the second output terminal according to the second input signal; and
- a lower circuit coupled between the buffer circuit and a low voltage terminal, and configured to withdraw current flowing through the second output terminal and the first output terminal according to the first input signal and to withdraw current flowing through the first output terminal and the second output terminal according to the second input signal, wherein a requirement for turning on the lower circuit is different from a requirement for turning on the upper circuit.

11. The duty cycle corrector of claim 10, wherein an absolute value of a difference between a duty cycle of the first input signal and fifty percent is greater than an absolute value of a difference between a duty cycle of the second output signal and fifty percent.

* * * * *